United States Patent [19]

Nishizawa

[11] 4,198,645

[45] Apr. 15, 1980

[54] SEMICONDUCTOR CONTROLLED RECTIFIER HAVING GATE GRID DIVIDING SURROUNDING ZONE INTO TWO DIFFERENT IMPURITY CONCENTRATION SECTIONS

[75] Inventor: Jun-ichi Nishizawa, Sendai, Japan

[73] Assignee: Semiconductor Research Foundation, Japan

[21] Appl. No.: 900,591

[22] Filed: Apr. 27, 1978

Related U.S. Application Data

[63] Continuation-in-part of Ser. No. 652,896, Jan. 27, 1976, abandoned.

[51] Int. Cl.² ............................................. H01L 29/80
[52] U.S. Cl. ..................................... 357/22; 357/20; 357/21; 357/38; 357/58; 357/89
[58] Field of Search ...................... 357/21, 22, 20, 58, 357/38, 89

[56] References Cited

U.S. PATENT DOCUMENTS

| | | | |
|---|---|---|---|
| 3,381,189 | 4/1968 | Hinkle et al. | 357/58 |
| 4,132,996 | 1/1979 | Baliga | 357/21 |

*Primary Examiner*—Joseph E. Clawson, Jr.
*Attorney, Agent, or Firm*—Craig and Antonelli

[57] ABSTRACT

A semiconductor controlled rectifier comprises a semiconductor substrate consisting of a first layer having a first conductivity type, a second layer having a second conductivity type and disposed adjacent to the first layer, and a plurality of base regions having the first conductivity type and a higher impurity concentration than the second layer and disposed at predetermined distances from one another within the second layer in at least one direction; a pair of electrodes are kept respectively in contact with the surfaces of the first and the second layer; and a control electrode is kept in contact with the respective base regions.

25 Claims, 8 Drawing Figures

SEMICONDUCTOR CONTROLLED RECTIFIER HAVING GATE GRID DIVIDING SURROUNDING ZONE INTO TWO DIFFERENT IMPURITY CONCENTRATION SECTIONS

CROSS-REFERENCE TO RELATED APPLICATION

This is a continuation-in-part of application Ser. No. 652,896, filed on Jan. 27, 1976 now abandoned.

BACKGROUND OF THE INVENTION

1. Field of the Invention

This invention relates to a semiconductor controlled rectifier which can control a large amount of electric power and effect a very rapid switching action.

2. Description of the Prior Art

A typical example of a conventional semi-conductor controlled rectifier (hereinafter referred to for brevity as SCR) comprises a semiconductor substrate having four alternate p- and n-type layers, a pair of main electrodes kept in ohmic contact with the outermost p- and n-layers and a control electrode kept in contact with one of the two intermediate layers.

With an SCR having such a structure as described above, when a control signal voltage in the form of a pulse is applied between the control electrode and one of the main electrodes (hereinafter referred to as first main electrode) which is in ohmic contact with the outermost layer (hereinafter referred to as first outermost layer) adjacent to the intermediate layer (hereinafter referred to as first intermediate layer) provided with the control electrode, with a forward voltage applied between the first main electrode and the remaining main electrode, i.e. second main electrode, the SCR turns on and current flows through the two main electrodes for the SCR. The SCR of this type is turned off, that is, switched from its conducting state to its non-conducting state, by inverting the polarity of the voltage applied between the first and the second main electrodes. There are, however, many cases where the SCR's must be turned off with the polarity of the forward voltage remaining unchanged. In such cases, the SCR is turned off by applying such a control signal voltage as to reverse-bias the PN junction between the first outermost layer (therefore the remaining outermost layer being referred to hereinafter as second outermost layer) and the first intermediate layer (therefore the remaining intermediate layer being referred to hereinafter as second intermediate layer), that is, between the control electrode and the first main electrode. This turn-off function will be described. The SCR in its conducting state is left under the condition that a great number of majority and minority carriers are injected into its layers, particularly the intermediate layers. Under this condition, if a control signal voltage to reverse-bias the PN junction between the first outermost layer and the first intermediate layer is applied between the control electrode and the first main electrode, the injection of the carriers from the first outermost layer into the first intermediate layer is blocked in the close vicinity of the control electrode and the carriers in the intermediate layers flow out of the control electrode. Accordingly, there exists a turn-off area only in the close vicinity of the control electrode. In the region remote from the control electrode, the control signal voltage has no strong influence upon the carriers since the first intermediate layers has a large lateral resistance. It is, therefore, impossible in that region to drain the carriers through the control electrode, to reverse-bias the PN junction between the first outermost layer and the first intermediate layer and therefore to block the injection of the carriers from the first outermost layer into the first intermediate layer. This means that the regions remote from the control electrode still remain conductive even after the application of the control signal voltage for turn-off, so that the SCR can not be switched into its turn-off state. It is necessary for turn-off of the SCR by using only the control signal voltage applied to the control electrode that the control signal voltage be high enough or that the conduction region of the SCR have a small cross-sectional area. With a high control signal voltage, the SCR can indeed be turned off even if the cross-sectional area of the conductive region is relatively large, but the influence of the control signal is still small in the regions remote from the control electrode, and consequently there is a drawback that the time required for establishing the turn-off state becomes adversely longer and then there is another drawback that the power required for turn-off action is large because of lower efficiency. On the other hand, if the cross-sectional area of the conduction region is small, the current capacity becomes adversely smaller.

As described above, with a conventional SCR, heavy current cannot be cut off at high speed and with high efficiency.

SUMMARY OF THE INVENTION

The object of this invention is to provide a semiconductor controlled rectifier hving a novel structure free from the drawbacks of the conventional one.

More concretely, the object is to provide a novel SCR which can control large electric power at a high switching speed with high efficiency.

The feature of the SCR according to the present invention is that at least one of the two intermediate layers is formed of a region doped with a comparatively large amount of an impurity. More concretely, the SCR according to the present invention is characterized by comprising a semiconductor substrate having at least four continuously-formed, alternate p- and n-type layers and having at least one of the intermediate layers formed of a region doped with a comparatively large amount of an impurity; a pair of main electrodes kept in ohmic contact with the outermost layers of the semiconductor substrate; and a control electrode kept in contact with a comparatively large amount of an impurity doped region. One of the intermediate layers rather heavily doped with the impurity is not necessarily defined to have the shape of a layer, but may have any shape functionally equivalent to a layer in use. For example, a region rather heavily doped with an impurity, in either the form of a plurality of stripes disposed at regular intervals in one direction or of a network, is referred to as a layer according to this invention.

According to the SCR having such a structure as described just above, the region rather heavily doped with an impurity serves as a conductor, so that the control signal voltage for turn-off applied between one of the main electrodes and the control electrode can have a sufficient influence on the entire conducting region without any voltage drop produced in the intermediate layer. Consequently, the whole conduction region can be driven rapidly and almost simultaneously into the cut-off state, independent of whether the cross-sectional area of the conductive region is large or small.

DESCRIPTION OF THE PREFERRED EMBODIMENTS

This invention will be described below by way of the embodiments with the aid of the attached drawings.

Figure 1:
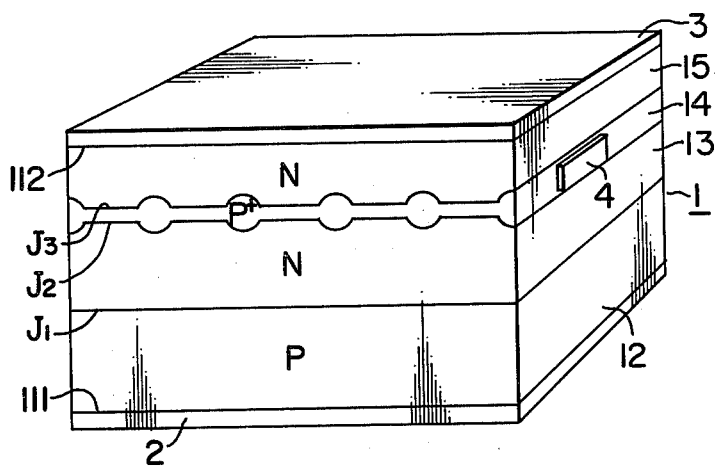
FIG. 1 is the perspective view of an SCR as a first embodiment of this invention.
Figure 2:
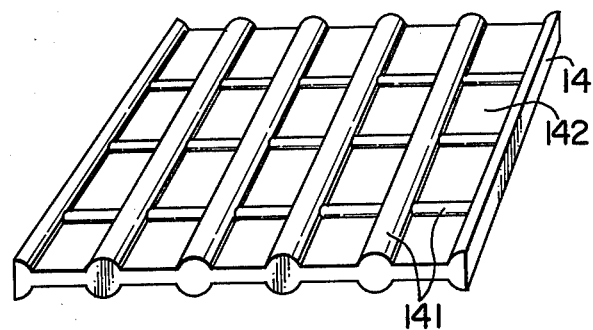
FIG. 2 is the perspective view of one of the intermediate layers of the SCR shown in FIG. 1.

FIG. 1 shows an SCR as a first embodiment of this invention, in which one of the intermediate layers consists of a newtwork portion and a flat plate-like portion thinner than the network portion and filling the meshes of the network. In FIG. 1 are shown a semiconductor substrate 1 having a first main surface 111 and a second main surface 112 which are disposed opposite to each other and having, between the main surfaces, four continuously-formed, alternate p- and n-type layers; 12 is a first outermost layer of p-type conductivity disposed on the first main surface 111; 13 a first intermediate layer of, for example, n-type conductivity having a relatively low impurity concentration, disposed adjacent to the first outermost layer 12 to form a first PN junction $J_1$ therebetween; 14 a second intermediate layer of for example, p-type conductivity, disposed adjacent to the first intermediate layer 13 to form a second PN junction $J_2$ therebetween; 15 a second outermost layer of, for example, n-type conductivity having a relatively low impurity concentration, disposed on the second main surface 112 adjacent to the second intermediate layer 14 to form a third PN junction $J_3$ therebetween; 2 a first main electrode disposed on the first main surface 111 and kept in ohmic contact with the first outermost layer 12; 3 a second main electrode disposed on the second main surface 112 and kept in ohmic contact with the second outermost layer 15; and 4 a control electrode in contact with the exposed surface of the second intermediate layer 14. The second intermediate layer 14 is more heavily doped with a comparatively large amount of an impurity than the portions of the first intermediate layer 13 and of the second outermost layer 15, adjacent to the second intermediate layer 14. The second intermediate layer 14 comprises, as shown in FIG. 2, a network portion 141 and a flat plate-like portion 142 thinner than the network portion 14 and filling the meshes of the network. The network portion 141 serves to distribute the control signal voltage throughout the second intermediate layer 14 without any appreciable voltage drop produced therein.

As the second intermediate layer 14 is heavily doped with a comparatively large amount of an impurity, the lateral resistance of the second intermediate layer 14 is reduced, so that the high-speed operation of the SCR may be effected. The greater part of the second outer layer 15 is formed to have a laterally uniform impurity concentration, so that the expansion of the depletion region induced by the second intermediate layer 14 and hence the main current flowing through the SCR become comparatively uniform.

In the SCR shown in FIG. 1, the control signal voltage applied to the control electrode reaches every part of the second intermediate layer 14, so that in the case of, for example, turn-off, a control signal voltage to reverse-bias the third PN junction $J_3$ is applied to the control electrode 4, and in turn the injected carriers are almost simultaneously spread into the entire region of the second intermediate layer 14 from the control electrode 4, so that the turn-off action is instantaneously accomplished. Therefore, an SCR having a large current capacity can be turned off instantaneously without consuming a large control power if such a second intermediate layer as described above is formed across the entire portion of the current-flowing path.

The impurity concentration of the first intermediate layer 13 may differ from that of the second outer layer 15. In such a case, there may be provided great advantages as described below:

In the case where the impurity concentration of the layer 13 is lower than that of the layer 15, the breakdown voltage between main electrodes 2 and 3 may be increased, and the expansion of the depletion region produced in the layer 13 by a control voltage applied to the second intermediate layer 14 will be increased and then the electric field will be spread extensively into the layer 13 and the carriers stored upon turn-off operation will be efficiently swept out, so that the turn-off time of the SCR may be remarkably shortened.

In the case where the impurity concentration of the layer 15 is lower than that of the layer 13, the expansion of the depletion layer induced by the control voltage into the layer 15 will be increased, and the change of a forward blocking voltage of the change of the control voltage, that is, a voltage gain will be increased. In addition, the stray capacitance between the layer 14 and the main electrode 3 will be reduced, so that the time constant may be reduced, thereby speeding up the turn-off action, and besides the layer 13 having the higher impurity concentration than the layer 15 will contribute to reduction of the voltage drop of the SCR in the conducting state, thereby reducing the power loss thereof.

Although this embodiment shows a PNPN structure type of an SCR, the gist of this invention can also be applied to PNIPN, NPINP, PN$\nu$PN, PN$\pi$PN structure types of elements or the like devices. Further conductor wires may be inserted through the network portion.

Figure 3:
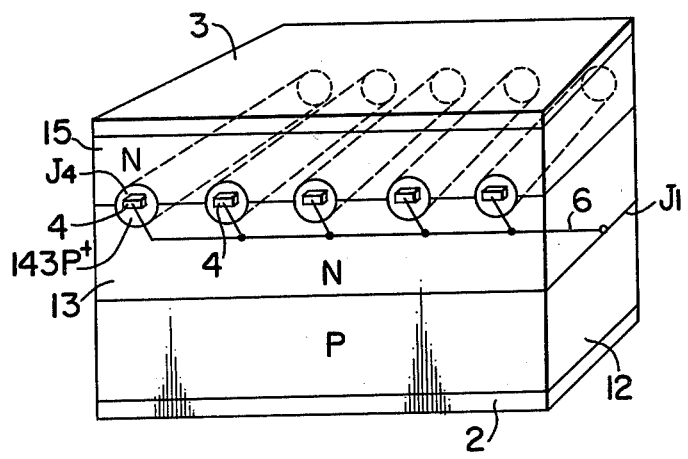
FIG. 3 is the perspective view of an SCR as a second embodiment of this invention.

FIG. 3 shows an SCR as a second embodiment of this invention, in which one of the intermediate layers is in the form of plural stripes disposed at regular intervals in one direction. The same reference numerals are applied to like parts as in FIG. 1. A plurality of stripe regions 143 disposed at regular intervals in one direction serves as the second intermediate layer 14. The stripe regions 143 are more heavily doped with a comparatively large amount of an impurity than the portions of the first intermediate layer 13 and of the second outermost layer 14, adjacent to the stripe regions 143. The first intermediate layer 13 is in contact with the second outermost layer 15 at the stripe regions 143 and the second and third PN junctions $J_2$ and $J_3$ are limited to fourth PN junctions J₄. The control electrodes 4 are kept in contact with the exposed parts of the respective stripe regions 143 and interconnected in common by a lead wire 6. The stripe regions may be interconnected in common at their end through a region heavily doped with an impurity. In that case only a single control electrode will suffice. Now, the turn-on and turn-off action of this SCR will be described. First, a control signal voltage to reverse-bias the fourth PN junctions $J_4$ is applied between the control electrodes 4 and the second main electrode 3. Accordingly, depletion regions are formed on both sides of the fourth PN junctions $J_4$ and the depletion regions are spread deeply into the first intermediate layer 13 and the second outermost layer 15 which are doped with a smaller amount of impurity. It is assumed that the amplitude of the control signal voltage and the distance between the respective stripe regions are so selected that each depletion region formed on both sides of each fourth PN junction $J_4$ by the application of the control signal voltage may be interconnected and that the combined depletion regions may completely isolate the first intermediate layer 13 from the second outermost layer 15. Under this condition, when a voltage to forward-bias the first PN junction $J_1$ is applied between the main electrodes, the SCR cannot be turned on due to the depletion regions formed near the stripe regions. Then, if the control signal voltage is removed while the forward voltage is applied between the main electrodes, a conductive state is established between the main electrodes, that is, the SCR is turned on. If in the conducting state a control signal voltage to reverse-bias the fourth PN junctions $J_4$ is applied between the control electrodes 4 and the second main electrode 3, the carriers in the first intermediate layer 13 and the second outermost layer 15 rapidly drain through the stripe regions 143 and the control electrodes 4, so that depletion regions are formed near the stripe regions 143 to block the conducting current, that is, the SCR is turned off. Thus, by disposing a plurality of stripe regions doped rather heavily with an impurity at regular intervals in one direction in the entire conduction region of the SCR and by using the stripe regions as a second intermediate layer, even a very large current can be abruptly interrupted the same as in the case of the first embodiment described above. The essential point of this second embodiment is that the distance between the juxtaposed stripe regions must be so selected that the respective depletion regions formed by the application of the control signal voltage may be interconnected. The impurity concentration of the first intermediate layer 13 differs from that of the second outermost layer 15 in order to enhance the effect of the second embodiment of this invention.

According to the second embodiment, there may be provided far the greater advantages than that based on the effect of the impurity concentration difference between the first intermediate layer 13 and the second outermost layer 15 according to the first embodiment of the invention, which is described below:

In the case where the impurity concentration of the layer 13 is lower than that of the layer 15, the breakdown voltage between the main electrodes 2 and 3 may be increased, and the expansion of the depletion region produced in the first intermediate layer 13 will be efficiently increased with aid of the shape of the second intermediate layer of the second embodiment, and the carriers stored upon turn-off operation will be very efficiently swept out, so that the turn-off time of the SCR may be remarkably shortened.

In the case where the impurity concentration of the layer 15 is lower than that of the layer 13, the expansion of the depletion region into the layer 15 will efficiently produce a potential barrier with aid of the shape of the second intermediate layer of the second embodiment, and then the voltage gain will be considerably increased. In addition, the stray capacitance between the layer 14 and the main electrode 3 will be further reduced as the size of the layer 14 is reduced, so that the further reduction of the time constant, that is, the further speed-up of the turn-off action may be attained, and besides the higher impurity concentration of the layer 13 than that of the layer 15 will contribute to realization of further reduction of the formed voltage-drop of the SCR in the conducting state with aid of the construction of the layer 14 allowing the layer 13 and the layer 15 to contact in part.

In this embodiment, the following modification may be realized in addition to modifications similar to those suggested in the description of the first embodiment. For example, the second intermediate layer 14 may consist of plural stripe regions juxtaposed at a regular interval in one direction and a flat plate-like portion having a smaller thickness than the stripe regions therebetween.

Figure 4:
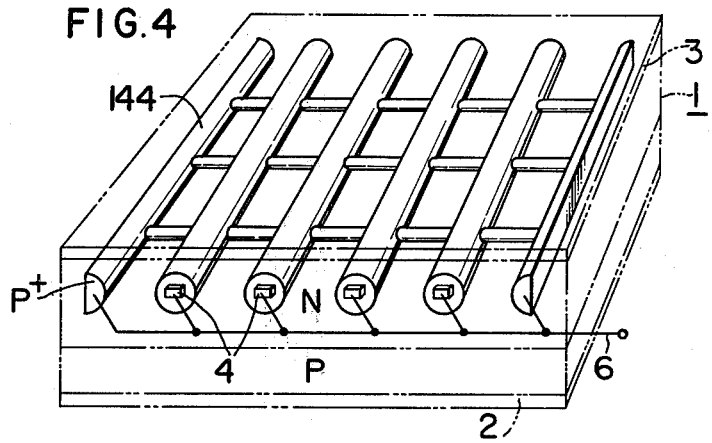
FIG. 4 is the perspective view of an SCR as a third embodiment of this invention.

FIG. 4 shows an SCR as a third embodiment of this invention, in which a network region 144 rather heavily doped with impurity serves as a second intermediate layer. This embodiment can be expected to perform the same operation as that of the second embodiment.

Figure 5:
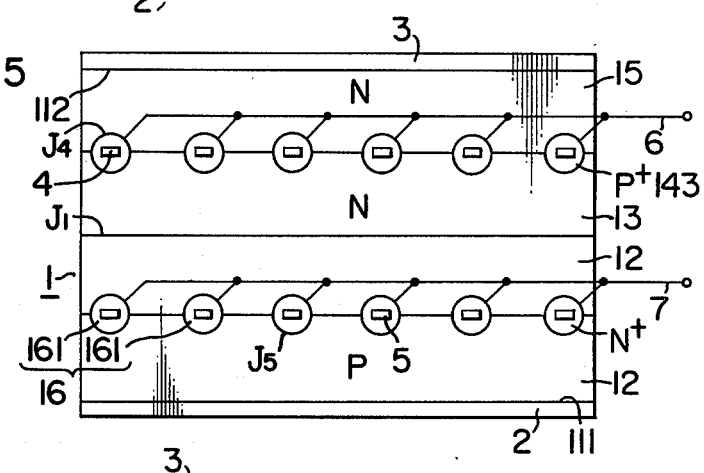
FIG. 5 is the front view of an SCR as a fourth embodiment of this invention.

FIG. 5 shows an SCR as a fourth embodiment of this invention, in which two intermediate layers are formed of plural stripe regions juxtaposed at regular intervals in one direction. The structure of this embodiment is as follows: In the structure as shown in FIG. 3, a plurality of stripe regions 161 of n-type conductivity are more heavily doped with a comparatively large amount of impurity than the first outermost layer 12, and juxtaposed at regular intervals in one direction in the first outermost layer 12, and additional control electrodes 5 are kept in contact with the exposed surface of the stripe regions 161, so that the stripe regions 161 serve as a third intermediate layer 16. The stripe regions 161 are functionally the same as the stripe regions 143 and the distance between adjacent stripe regions 161 is selected so that when a control signal voltage to reverse-bias the PN junctions $J_5$ between the stripe regions 161 and the first outermost layer 12 is applied to the additional control electrodes 5 and the depletion regions formed near the PN junctions $J_5$ may be interconnected. The additional control electrodes 5 are interconnected in common by a lead wire 7. The SCR thus constructed can be turned off and on respectively by applying and removing a control signal voltage to reverse-bias the PN junctions $J_4$ and $J_5$ simultaneously to and from the control electrodes 4 and the additional control electrodes 5.

According to this embodiment in which there are two intermediate layers formed of stripe regions, the draining of the carriers is faster than according to the second embodiment described above. Therefore, this embodiment has an advantage that the turn-off action can be accomplished in a shorter time. Namely, in this embodiment which has two kinds of control electrodes 4 and 5, the areas of the regions into which the control signal voltages applied to the control electrodes 4 and 5 is spread can be made smaller than the corresponding area in each of the previous embodiments. Accordingly, the turn-off action speed can be increased and also the current required for turn-off action can be diminished by connecting the peripheries of the stripe regions by depletion regions formed due to the potential differences between the stripe regions and the adjacent layers.

Like the foregoing embodiments, the impurity concentration of the layer 13 may differ from that of the layer 15. In that case, there may be provided the same great advantages as described with respect to the second embodiment. In the case where the foregoing structure is applicable to the layer 16, the respective sections of the layer 12 adjacent to the main electrode 2 and the layer 13 correspond to the layer 15 and the layer 13, respectively, so that the same effect as that of the foregoing structure may be obtained. Needless to say, the above-described structure are simultaneously applicable to both of the layer 14 and the layer 16, and in that case the further effect may be obtained.

In this embodiment, the following modifications may be realized in addition to modifications similar to those suggested in the description of the first embodiment. For example, the stripe regions 143 and/or 161 may be replaced by the intermediate layer as shown in FIG. 2 consisting of a network portion and a flat plate-like portion, the intermediate layer as shown in FIG. 4 formed of a network, or an intermediate layer in the form of flat-plate-like portions. Moreover, conductor wires may be embedded in the network portion and the stripe regions.

Figure 6:
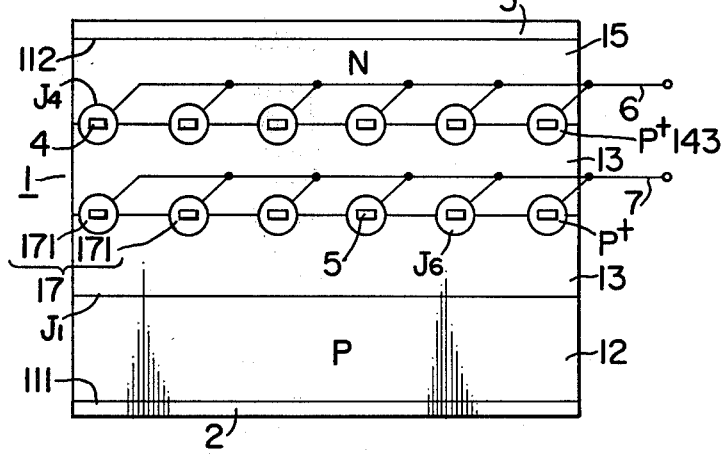
FIG. 6 is the front view of an SCR as a fifth embodiment of this invention.

FIG. 6 shows an SCR according to a fifth embodiment of this invention, in which two kinds of intermediate layers are provided in the same layer, each of the intermediate layers being formed of plural stripe regions juxtaposed at regular intervals in one direction. The structure of this embodiment is as follows: In the SCR shown in FIG. 3 as the second embodiment of this invention, a fourth intermediate layer 17 formed of plural stripe regions 171 juxtaposed at regular intervals in one direction is provided in the first intermediate layer 13 and additional control electrodes 5 are kept in contact with the exposed surfaces of the stripe regions 171. The stripe regions 171 are of the conductivity type opposite to that of the first intermediate layer and each stripe region 171 is more heavily doped with a comparatively large amount of impurity than the first intermediate layer 13. Moreover, the distance between two adjacent regions of juxtaposed stripe regions 171 are so selected that the depletion regions formed when the PN junctions $J_6$ between the first intermediate layer and the stripe regions 171 are reverse-biased by the control signal voltage applied to the additional control electrodes 5, may be interconnected.

The SCR having the above described structure is turned off and on respectively by applying and removing the control signal voltage to and from the intermediate layers 14 and 17. This embodiment has a faster carrier draining speed than the second embodiment since the carriers are drained through the two kinds of intermediate layers 14 and 17. Consequently, the SCR can be turned off at higher speed.

Like the foregoing embodiment, the impurity concentration of the layer 13 may differ from that of the layer 15, and as a result there may be provided the same great advantages as described in the foregoing embodiment. For the layer 17, the further effect may be obtained by differentiating the impurity concentration of the section of the layer 13 adjacent to the layer 12 from that of the section of the layer 13 adjacent to the layer 15. In this case, there may be provided such advantages that the expansion of the depletion region and the stored-carriers sweeping-out action may be more precisely controlled.

In addition to the modifications of this embodiment similar to those of the first embodiment the following modifications may be practiced. Namely, the fourth intermediate layer 17 may be formed of a network region alone, a flat plate-like region alone or a combination of network and flat plate portions. Moreover, conductor wires may be embedded in the network and the stripe regions.

Figure 7:
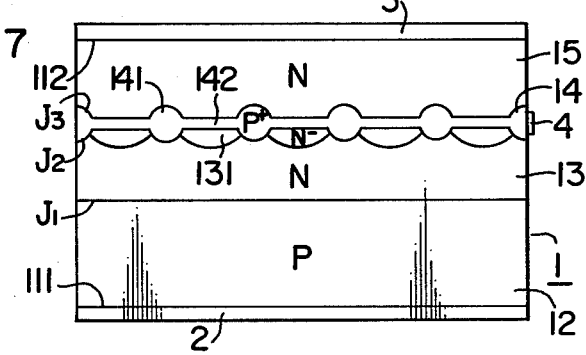
FIG. 7 is the front view of an SCR as a sixth embodiment of this invention.

FIG. 7 shows an SCR as a sixth embodiment of this invention, in which a layer adjacent to a heavily doped intermediate layer is of a conductivity type opposite to that of the heavily doped intermediate layer and actually has a lower impurity concentration than a first intermediate layer. The structure of this embodiment is as follows. In the SCR shown in FIG. 1 as the first embodiment of this invention, an auxiliary region 131 is formed in the portions of the first intermediate layer 13, adjacent to the flat plate-like portions 142 of the second intermediate layer 14, the auxiliary region 131 has the same conductivity type as the first intermediate layer 13 and a lower impurity concentration than the first intermediate layer 13. The SCR having this structure can provide the same performance as the first embodiment and also the depletion layer formed when the third PN junction $J_3$ is reverse-biased can be more deeply spread in the case of this embodiment than the first embodiment. Consequently, this embodiment is accompanied by such merits that the distributed capacitances are decreased and that the effects of blocking current are improved.

Also according to this embodiment, the impurity concentration of the layer 13 may differ from that of the layer 15, and in that case, there may be provided the same effect as that of the first embodiment.

Figure 8:
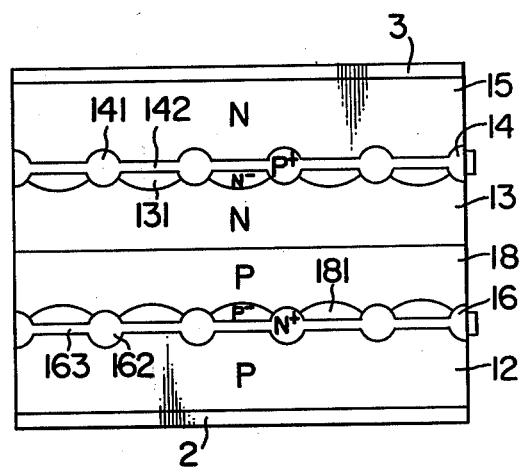
FIG. 8 is the front view of an SCR as a seventh embodiment of this invention.

FIG. 8 shows the seventh embodiment of the invention in which the layers 14 and 16 as shown in FIG. 5 are altered to the intermediate layer as shown in FIG. 2, and besides the auxiliary region as shown in FIG. 7 is applied to both the layers 14 and 16.

The structure of this embodiment is as follows: The intermediate layer 14 corresponding to the intermediate layer 14 of FIG. 5 is constituted by the stripe or network portion 141 and the flat plate-like portion 142, and the intermediate layer 16 is also constituted by the strip or network portion 162 and the flat plate-like portion 163. In addition, the first auxiliary region 131 is provided on the portion of the layer 13, which is in contact with the flat plate-like portion 142 as in the embodiment of FIG. 7 and the second auxiliary region 181 is disposed on the portion of the layer 18, which is in contact with the flat plate-like portion 163. According to this embodiment, the same effects as described in the sixth embodiment may be still more efficiently attained. Either one of the intermediate layers 14 and 16 with the corresponding one of the first and second auxiliary regions 131 and 181 may suffice. Besides, the intermediate layer 14 and/or 17 of FIG. 6 may be altered to the structure of the stripe or network portion and the flat plate-like portion and also may be provided with the auxiliary region on the side of layer 12.

Finally, an example of the process for producing an SCR according to this invention will be described.

On a n+-type silicon substrate having a resistivity of 0.01 Ω-cm and a thickness of 250μ is epitaxially grown an n⁻-type layer having an impurity concentration of $1\times10^{13}$ cm$^{-3}$, up to a thickness of 20μ, on which a p-type layer having an impurity concentration of $5\times10^{20}$ cm$^{-3}$ and the shape of a network or plural stripes juxtaposed at regular intervals is selectively formed. The p-type layer serves as an intermediate layer rather heavily doped with an impurity. An n⁻-type layer having an impurity concentration of about $1\times10^{13}$ and cm$^{-3}$ is grown and another intermediate layer doped with an impurity is formed of a network portion or stripe regions to serve as low resistance region and a flat plate-like portion filling the meshes of the network or connecting the stripes, the flat plate-like portion being thinner than the network portion. An n⁻-type layer having an impurity concentration of about $5\times10^{13}$ cm$^{-3}$ is grown and finally a p-type layer having an impurity concentration of about $1\times10^{20}$ cm$^{-3}$ is grown to complete an SCR according to this invention.

Next, another example of the process for producing an SCR according to this invention will be described.

On an n⁻-type silicon substrate having a thickness of about 150μ and an impurity concentration of about $1\times10^{13}$ cm$^{-3}$ is selectively formed a p-type stripe or network region having an impurity concentration of $5\times10^{19}$ cm$^{-3}$ and then epitaxially grown an n-type layer having an impurity concentration of about $1\times10^{15}$ cm$^{-3}$ thereon, and further formed an n+-type layer having an impurity concentration of about $1\times10^{20}$ cm$^{-3}$. On the opposite surface of the n⁻-type substrate to the surface on which the stripe or network region is formed, a p+-type layer having about $1\times10^{20}$ cm$^{-3}$ is formed, and then electrodes are disposed on an n+-type and a p+-type outermost layer and the stripe or network portion thereby to complete the SCR.

The foregoing examples of the process for producing an SCR shall not put a limitation on the process for producing an SCR according to this invention, and the process for formation of each layer, the impurity concentration, thickness and so forth may be optionally changed and the conductivity type also may be inverted.

The layers 14, 16, and 17 of this invention are more heavily doped with an impurity than the adjacent regions thereto, so that the main current flowing through the channel may be controlled, and the thickness of those respective layers 14, 16, and 17 is formed to be thin, so that the main current may be controlled without being obstructed. When those layers 14, 16 and 17 are formed into the stripe or network portion, the dimensions and pitch are determined so that the carriers may be controlled by the depletion region which is extensively spread into the channel. That is, if the dimensions are determined so that the channel may be pinched off by a zero bias voltage, the main current may be controlled by a relatively smaller gate voltage, and if the dimensions are determined so that the channel may be pinched off by not a zero bias voltage but a reverse bias voltage, the loss of the main current may be lowered and the rapid switching action may be effected.

The present invention has been hitherto described by way of various embodiments, but it is by no means limited to the previous embodiments. For example, this invention can also be applied to a device in which the ends of PN junctions are exposed in the main surfaces.

With the embodiments shown in FIGS. 5 and 6 having two intermediate layers of high impurity concentration, it is effective for the purpose of decreasing the voltage developed across the SCR in its conducting state to provide a self-biasing effect in the conducting state by inserting external resistors or series-resistance regions in series with at least one of the intermediate layers and to send a control signal voltage through a point of relatively low series-resistance or to short that point at the turn-off operation.

As described above, according to the SCR embodying the present invention having one or two intermediate layers of low resistance and in the form of network or juxtaposed plural stripes, the control over a large area of the conduction region is effected; the switching characteristic is excellent since thermal loss is very small; and the turn-on and turn-off can be completed in a very short time. Moreover, since the control signal voltage acts immediately on the carriers, the current for the turn-off period flows uniformly through the conduction path in the intermediate layers, and obviously the voltage applied to the gate draws and repairs carriers in a very short period of time. Consequently, no current concentration takes place so that the stability and the current capacity of the device can be improved. Further, the time required for turn-on can be made uniform and therefore the precision and the efficiency of turn-on and turn-off operations can be much improved. Furthermore, these results clearly demonstrate that by merely controlling the gate voltage, current can be switched on and off, even for high D.C. power operation.

I claim:

1. A semiconductor controlled rectifier comprising:
   a first semiconductor region of one conductivity type;
   a second semiconductor region of the other conductivity type disposed adjacent to said first semiconductor region to form a PN junction between said first and second semiconductor regions;
   a third semiconductor region of the said conductivity type as said second semiconductor region and formed in said first semiconductor region to divide said first semiconductor region into a first outer and a first inner section, said third semiconductor region having a smaller thickness than that of said first inner region and comprising a first plurality of stripe-shaped sub-regions, and said first outer and first inner sections having respective different impurity concentrations which are lower than that of said third semiconductor region;
   a first electrode region formed on said first outer region; and
   a second electrode region formed on said second semiconductor region.

2. A semiconductor controlled rectifier as claimed in claim 1, wherein an impurity concentration of said first outer section of said first semiconductor region is lower than that of said first inner section thereof.

3. A semiconductor controlled rectifier as claimed in claim 1, wherein said third semiconductor region further comprises a plurality of flat plate-like sub-regions having a smaller thickness than that of said stripe-shaped sub-regions and filling the intervals of said stripe-shaped sub-regions.

4. A semiconductor controlled rectifier as claimed in claim 3, wherein said stripe-shaped sub-regions project into both said first outer and first inner sections.

5. A semiconductor controlled rectifier as claimed in claim 1, wherein said first outer and first inner sections are in contact with each other, thereby to form a current-flowing path between said first and second electrode regions.

6. A semiconductor controlled rectifier as claimed in claim 3, further comprising auxiliary regions having the same conductivity type as said first semiconductor region and a lower impurity concentration than said first inner section, said auxiliary region being formed in said first semiconductor region to be in contact with said flat plate-like sub-regions.

7. A semiconductor controlled rectifier as claimed in claim 6, wherein said auxiliary regions are formed in said first inner section.

8. A semiconductor controlled rectifier as claimed in claim 1, further comprising a fourth semiconductor region having the same conductivity type as said first semiconductor region and formed in said second semiconductor region to divide said second semiconductor region into a second outer and a second inner section, said fourth semiconductor region comprising a first plurality of stripe-shaped sub-regions, and said second outer and second inner sections each having a lower impurity concentration than that of said fourth semiconductor region.

9. A semiconductor controlled rectifier as claimed in claim 1, further comprising a fifth semiconductor region having the same conductivity type as said second semiconductor region and formed in said first outer section to further divide said first outer section into a third outer and a third inner section, said fifth semiconductor region comprising a first plurality of stripe-shaped sub-regions, and said third outer and third inner sections each having a lower impurity concentration than that of said fifth semiconductor region.

10. A semiconductor controlled rectifier as claimed in claim 1, further comprising a sixth semiconductor region having the same conductivity type as said second semiconductor region and formed in said first inner section to further divide said first inner section into a fourth inner and a fifth inner section, said sixth semiconductor region comprising a first plurality of stripe-shaped sub-regions, and said fourth and fifth inner sections each having a lower impurity concentration than that of said sixth semiconductor region.

11. A semiconductor controlled rectifier as claimed in claim 1, wherein said third semiconductor region comprises at least a second plurality of stripe-shaped sub-regions which are connected with at least one of said first plural stripe-shaped sub-regions.

12. A semiconductor controlled rectifier as claimed in claim 1, wherein the impurity concentrations of said first outer and first inner sections are lower than $1 \times 10^{14}$ cm$^{-3}$.

13. A semiconductor controlled rectifier as claimed in claim 1, wherein an impurity concentration of one of said first outer and inner sections is at least twice as high as that of the other section.

14. A semiconductor controlled rectifier as claimed in claim 1, wherein the impurity concentration of said third semiconductor region is higher by at least an order than that of said first outer and first inner sections.

15. A semiconductor controlled rectifier as claimed in claim 2, wherein said third semiconductor region comprises a first plurality of stripe-shaped sub-regions and a plurality of flat plate-like sub-regions, said flat plate-like sub-regions having a smaller thickness than that of said stripe-shaped sub-regions and filling the intervals of said stripe-shaped sub-regions.

16. A semiconductor controlled rectifier as claimed in claim 15, wherein said stripe-shaped sub-region project into both said first outer and first inner sections.

17. A semiconductor controlled rectifier as claimed in claim 2, wherein said first outer and first inner sections are in contact with each other, thereby to form a current-flowing path between said first and second electrode regions.

18. A semiconductor controlled rectifier as claimed in claim 2, further comprising a fourth semiconductor region having the same conductivity type as said first semiconductor region and formed in said second semiconductor region to divide said second semiconductor region into a second outer and a second inner section, said fourth semiconductor region comprising a first plurality of stripe-shaped sub-regions, said second outer and inner sections each having a lower impurity concentration than that of said fourth semiconductor region.

19. A semiconductor controlled rectifier as claimed in claim 2, further comprising a sixth semiconductor region having the same conductivity type as said second semiconductor region and formed in said first inner section to further divide said first inner section into a fourth inner and a fifth inner section, said sixth semiconductor region comprising a first plurality of stripe-shaped sub-regions, said fourth and fifth inner sections each having a lower impurity concentration than that of said sixth semiconductor region.

20. A semiconductor controlled rectifier as claimed in claim 1, wherein the impurity concentration of said first inner section is lower than that of said first outer section.

21. A semiconductor controlled rectifier as claimed in claim 20, wherein said third semiconductor region comprises a first plurality of stripe-shaped sub-regions and a plurality of flat plate-like sub-regions having a smaller thickness than that of said stripe-shaped sub-region and filling the intervals of said stripe-shaped sub-regions.

22. A semiconductor controlled rectifier as claimed in claim 20, wherein said stripe-shaped sub-regions project into both said first outer and first inner sections.

23. A semiconductor controlled rectifier as claimed in claim 20, wherein said first outer and first inner sections are in contact with each other, thereby to form a current-flowing path between said first and second electrode regions.

24. A semiconductor controlled rectifier as claimed in claim 20, further comprising a fourth semiconductor region having the same conductivity type as said first semiconductor region and formed in said second semiconductor region to divide said second semiconductor region into a second outer and a second inner section, said fourth semiconductor region comprising a first plurality of stripe-shaped sub-regions, said second outer and inner sections each having a lower impurity concentration than that of said fourth semiconductor region.

25. A semiconductor controlled rectifier as claimed in claim 20, further comprising a sixth semiconductor region having the same conductivity type as said second semiconductor region and formed in said first inner section to further divide said first inner section into a fourth inner and a fifth inner section, said sixth semiconductor region comprising a first plurality of stripe-shaped sub-regions, said fourth and fifth inner sub-regions each having a lower impurity concentration than that of said sixth semiconductor region.

* * * * *